United States Patent [19]
Hester

[11] 3,973,165
[45] Aug. 3, 1976

[54] POWER SUPPLY FOR A MICROWAVE MAGNETRON

[75] Inventor: Thomas Eugene Hester, Fort Wayne, Ind.

[73] Assignee: Litton Systems, Inc., Huntington, Ind.

[22] Filed: Apr. 28, 1975

[21] Appl. No.: 572,105

[52] U.S. Cl.................................. 315/105; 307/296; 315/207; 315/278; 328/261; 331/87; 331/113 A
[51] Int. Cl.²......................................... H03B 9/10
[58] Field of Search .......... 328/261, 262, 267, 268, 328/270, 66, 67, 230, 233, 252; 321/2; 315/39.51, 207, 105, 278; 307/296, 297; 331/86, 87, 185, 186

[56] References Cited
UNITED STATES PATENTS

| | | | |
|---|---|---|---|
| 3,569,855 | 3/1971 | Noda | 331/185 X |
| 3,619,713 | 11/1971 | Biega et al. | 315/105 |
| 3,902,099 | 8/1975 | Feinberg | 315/105 |

*Primary Examiner*—John Zazworsky
*Attorney, Agent, or Firm*—Ronald M. Goldman

[57] ABSTRACT

In a microwave energy generating system, a combination of a magnetron which generates microwave energy and an inverter which converts DC voltage to high frequency AC voltage are employed. The magnetron includes a heater-cathode and an anode. The inverter includes a transformer having a gapped ferrite core, a center tapped primary winding which divides the primary into two portions, and at least a first high voltage secondary winding and a second low voltage secondary winding for the magnetron heater, and means for switching current through each winding half alternately at a periodic high frequency rate, substantially above 60 Hz., to produce a high frequency magnetic field in said ferrite core, and means, including inductor means, are provided for providing DC current into said primary winding at said center tap. High frequency high voltage AC from the first secondary is rectified and coupled to the magnetron and high frequency low voltage AC is coupled from the second secondary to the magnetron heater to enable the magnetron to generate microwave energy. The pulsing nature of the high voltage applied to the magnetron is believed to avoid "mismoding" of the magnetron and a need for a separate heater transformer is avoided. In a further aspect of the invention, the DC applied to the primary winding is obtained from an AC source and rectifier combination.

11 Claims, 2 Drawing Figures

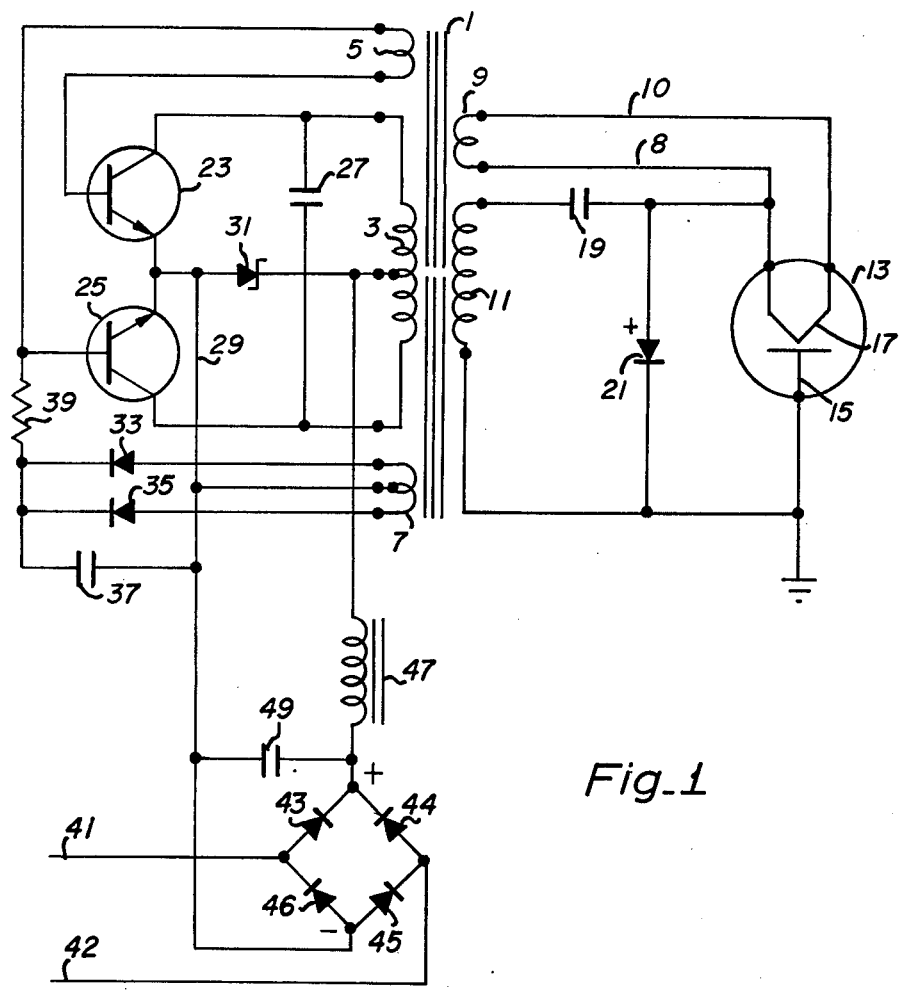
Fig_1
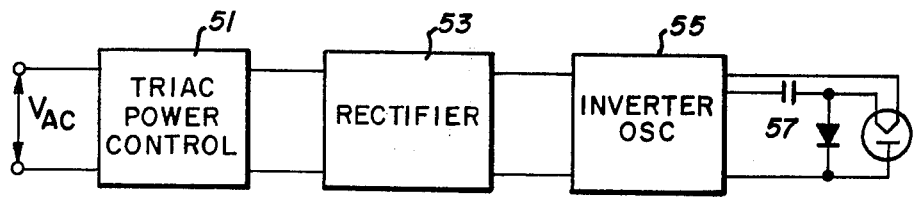
Fig_2

POWER SUPPLY FOR A MICROWAVE MAGNETRON

BACKGROUND OF THE INVENTION

This invention relates to a power supply for a microwave magnetron and to a microwave energy generating system incorporating such power supply and magnetron.

The magnetron is a type of microwave vacuum tube used in conventional microwave ovens as the generator of continuous wave microwave frequency radiation. In turn, the radiation heats or cooks foodstuffs exposed thereto in the oven.

Heretofore, various types of electrical power supplies have been used to convert low line voltages, typically on the order of 110 or 220 volts AC RMS, to the high voltage levels required to supply the microwave magnetron, typically on the order of 3000 or 4000 volts. Such power supplies at present typically include one or more large, heavy and relatively expensive iron core electrical transformers as a component element for the purpose of raising the AC voltage level from the line voltage to the desired high level AC voltage. As a practical matter, power supplies developed for that application employ no more than the minimum number of components necessary to perform the function of providing a predetermined power level to the magnetron consistent with reliability and safety so that the cost of manufacture of the microwave oven is as low in price as possible and preferably within the price range of the ordinary consumer. In view of those cost requirements, the use of relatively sophisticated laboratory type variable power supplies, although suitable and even preferable, technically, for this purpose is economically impractical.

Microwave oven manufacturers presently desire microwave ovens capable of operating at different power levels so that the radiation level may be "tailored" to heat or cook different types of food. Thus in some prior art microwave ovens means have been employed to vary the power level from one level, 600 watts, to another power level, 400 watts, for example by switching a capacitor into or out of the circuit in the high voltage section of the power supply. One drawback to the obvious extension of that principle is that the addition of further capacitors and switches necessary to allow approximation of a continuously variable power level is large. Inasmuch as these electrical components are located wholly or partially in the high voltage section where the voltage range between 3,000 to 4,000 volts they must be capable of functioning at high voltages. Components fulfilling those requirements are very expensive. Other known modifications to existing cooker magnetron power supplies for the magnetron to permit power level adjustment are also known. Thus a device is available for adjusting the magnetron filament current, an operational parameter of the magnetron, which in turn varies the electronic emission of the magnetron and hence its output power level. Other approaches to control the electrical current supplied to the magnetron include Triac, SCR and saturable reactor. All of the foregoing designs, however, retain in their structure the heavy expensive iron core transformer, as they must operate at mains frequency (typically 50 or 60 Hz.). The expensive sophisticated laboratory type power supplies, though suitable, remain economically prohibitive.

Two additional approaches appear in the patent literature as has been made known to me relevant to this subject matter. Recognizing that the core size of a transformer, hence its weight, can be reduced by employing AC of a higher frequency than the 60 Hz. line frequency, U.S. Pat. No. 3,735,237 to Derby describes a specific structure that employs high frequency AC to be applied to the magnetron. The disclosed apparatus appears to increase in component complexity and number, however, and does not provide filament current to the magnetron from the power transformer. A second patent, U.S. Pat. No. 3,862,390 to Noda, describes another type of high-frequency generator which employs high frequency AC for the magnetron and which varies power level. In applicant's opinion, Noda requires a separate filament transformer and perhaps other apparatus for the magnetron, none of which is disclosed, and applicant is otherwise unable to describe the ability or reliability of the disclosed circuit in performance of its intended purpose in actual practice.

SUMMARY OF THE INVENTION

The present invention provides a power supply for a microwave magnetron as well as a microwave energy generating system employing that power supply which employs AC of a frequency higher than line frequency and which avoids the use of the heavy expensive iron core transformer and, as well, avoids the necessity of a separate filament transformer for the microwave magnetron. The power supply system of the invention provides a circuit which is more readily adaptable to selective adjustment in output power level so as to permit the magnetron power output to be controlled as desired over a substantial range through use of readily available component parts, is simple in structure, and is economical to manufacture.

The invention includes a rectifying means for converting AC line voltage to a DC voltage which is coupled to an inverter-oscillator so as to provide current into the inverter-oscillator. The inverter-oscillator converts the DC voltage to high voltage AC and to a low voltage AC. And a magnetron is coupled to the output of the inverter-oscillator. An additional aspect of the invention includes a power control circuit, such as a conventional Triac apparatus, in circuit preceding said rectifier means.

In a specific aspect of the invention, the inverter is of the push-pull type which includes a ferrite core transformer having a center tapped primary winding, a first center tapped low voltage secondary, a second low voltage secondary, a third low voltage secondary and a fourth high voltage secondary, a pair of substantially identical transistors having their respective bases coupled to opposite ends of said first controlled secondary having their emitters coupled in common to the DC source and having their collectors connected to respective ends of the primary winding, and an inductance connected in series circuit between the source and the center tap of said primary winding, whereby said transistors are driven in push-pull. In addition, DC bias supply means for said transistors include rectifier means connected in circuit with said first low voltage secondary and resistor means connected to the base of one of said transistors and said rectifier means.

In another aspect of the invention, the transistors comprising silicon type transistors and a capacitor means are connected across the primary winding.

Further in accordance with the invention, the low voltage third secondary is connected to the filament circuit of a magnetron and the high voltage secondary is connected in series circuit with a capacitor to the magnetron and a high voltage rectifier means is connected in shunt of said magnetron.

The foregoing structure characteristic of my invention, as well as the objects and advantages thereof, is better understood by considering the detailed description of a preferred embodiment of my invention which follows taken together with the figures of the drawing.

BRIEF DESCRIPTION OF DRAWINGS

In the drawings:

FIG. 1 illustrates schematically a preferred embodiment of the invention; and

FIG. 2 illustrates symbolically another embodiment of the invention.

DESCRIPTION OF THE PREFERRED EMBODIMENTS

A transformer 1 includes a primary winding 3, a low voltage control secondary winding 5, a low voltage secondary winding 7, another low voltage secondary winding 9 and a high voltage secondary winding 11. Each of the windings comprises a predetermined number of turns of insulated electrical wire which are formed atop one another and electrically insulated from one another and positioned on a ferrite core, a magnetic material useful for transformers operated at high frequencies, which core is represented in the figure by the three parallel lines. The core has an air gap in the magnetic circuit thereof, as represented in the figure, to predetermine the value of primary inductance. The primary winding 3 contains a center tap, an electrical lead connected to the turn in the middle of the primary winding, and secondary 7, as shown, also contains a center tap.

A conventional microwave magnetron is schematically illustrated at 13. The magnetron has its anode 15 connected to electrical ground potential or "ground" and its filament 17, a combined filament and electron emissive cathode, connected in a series electrical circuit with the low voltage secondary winding 9 by electrical leads 10 and 11. A capacitor 19 is connected in series circuit between one end of high voltage secondary 11 and filament 17. A rectifier diode 21 is connected in circuit between filament 17 and anode 15 or to ground. The positive polarity terminal or anode of diode 21 is connected as shown in circuit with the cathode 17. The remaining end of secondary winding 11 is connected to electrical ground potential as illustrated.

Each of transistors 23 and 25 includes an emitter, a base and a collector as designated in the figure by conventional schematic symbols. The base of transistor 23 is connected in circuit with one end of control secondary 5 and the base of transistor 25 is connected in circuit with the remaining end of control secondary 5. The collectors of each of the transistors are connected in electrical circuit with alternate ends, respectively, of primary winding 3 and a capacitor 27 is electrically connected across the primary winding. The emitters are connected together electrically in common and in circuit with electrical lead 29. A Zener diode 31 is connected in circuit between the center tap of primary 3 and lead 29 with its positive polarity end, the anode, connected as illustrated. The center tap of secondary 7 is also connected to electrical lead 29 as illustrated. One end of winding 7 is connected in circuit to the anode of rectifier diode 33 and the other end of winding 7 is connected in circuit with the anode end of a second rectifier diode 35 and the cathode ends of diodes 33 and 35 are connected in common to one end of a capacitor 37. The remaining end of capacitor 37 is connected in circuit with lead 29.

A resistor 39 is connected in circuit between one end of capacitor 37 and the base of transistor 25. Electrical leads 41 and 42 represent the electrical connections to the AC electrical source, such as the 120-volt 60-hertz AC available at most electrical outlets. A bridge rectifier consisting of four diodes 43, 44, 45 and 46, is provided. Leads 41 and 42 are connected to the respective inputs of the bridge rectifier. The respective positive polarity and negative polarity DC voltage output terminals of the bridge rectifier are designated by "+" and "−" symbols.

An inductor 47 is connected electrically in series between the positive polarity output terminal of the bridge rectifier and the center tap of winding 3. The inductor has an inductance greater than the electrical inductance of the transformer primary. Electrical lead 29 is electrically connected to the negative output terminal of the bridge rectifier. A capacitor 49 is connected in circuit across the bridge rectifier. Capacitor 49 is of any capacitance value which minimally absorbs any radio frequency energy present on the lines. It is noted however that a more expensive capacitor of greater capacitance value may be employed which in addition to absorbing the radio frequency energy filters or "smooths" the DC from the bridge rectifier.

As is apparent to those skilled in the art, the component elements schematically illustrated in the figure are of known structure. Hence the structural details of those elements are not further described inasmuch as that information does not contribute to the understanding of the present invention. And although an illustration of the physical appearance of the elements of the preferred embodiment might be of some interest, such an illustration is not included in the drawings in the interests of brevity, particularly inasmuch as the electrical schematic representation of the embodiment of the invention is understood by those skilled in the art and is more informative than any illustration complicated by mechanical details.

In operation, the line voltage AC is fed to the input of the bridge rectifier, consisting of diodes 43 through 46. The bridge rectifier rectifies or, as otherwise stated, converts AC or voltage of alternating polarity to a DC, a voltage whose polarity is constant. The positive polarity appears at the output indicated by the "+" symbol and the negative polarity voltage appears at the output indicated by the "−" symbol in the figure. Direct current flows through inductor 47 and into the primary winding 3. By design, the inductance of inductor 47 is substantially greater than the inductance of primary winding 3. If the DC source is highly filtered DC then a substantially constant DC current would be established. With the essentially unfiltered DC obtained from the bridge rectifier, containing line frequency "ripple," the inductor prevents the high frequency voltage and currents from reaching the rectifier bridge and allows high ripple DC current to flow into the primary.

Like other inverter-oscillators existing in the prior art, its purpose is to receive a DC voltage and convert that voltage to a high frequency AC voltage at an output.

Inverters of the aforedescribed circuit configuration have been used for supplying electrical power to start and operate fluorescent type lamps. The particular circuit arrangement of the aforedescribed inverter-oscillator is based in part on my prior inverter-oscillator for fluorescent lamps, described more fully in my copending application Ser. No. 551,712, filed Feb. 21, 1975, and in part on the disclosure in a reference to the book "Transistor Inverters and Converters," Rodden, Wireless World, published by D. Van Nostrand Company, 1963, in particular pages 182 through 194, which I have determined to be useful in the powering of a microwave magnetron and which I have thus adapted to that purpose.

In the inverter-oscillator, transistors 23 and 25 function as electrical switches connected in push-pull; the transistors operate, alternately, between the "on" or current conducting condition and the "off" or non-current conducting condition. Thus when transistor 23 is "on" the other transistor 25 is "off," and vice versa. From a direct current standpoint on one-half cycle of the AC frequency of oscillation of the inverter-oscillator, current passes from the positive terminal of the bridge rectifier through inductor 47 into the center tap of primary winding 3, through one-half the primary winding, to the collector of transistor 25 and therethrough, out the emitter and over lead 29 to the negative terminal of the bridge rectifier to complete a current path. On the opposite AC half-cycle in which transistor 25 is "on," current passes from the positive terminal of the bridge rectifier through the inductor 47, the center tap of the primary winding 3, through the remaining half of primary winding 3 over the electrical lead to the collector of transistor 25 and therethrough, out the emitter over to lead 29 and back to the negative terminal of the bridge rectifier to complete a current path. Thus current flows through a part of winding 3 in one direction when transistor 23 is conducting, and flows through winding 3 in the opposite direction when transistor 25 is conducting. This creates an alternating magnetic field in the transformer core.

In that manner, through transformer action a low AC voltage is developed across center tapped winding 7. The AC output of the winding is rectified to DC by the full wave rectifier consisting of diodes 33 and 35 to charge capacitor 31 to a predetermined voltage and this voltage is applied as a bias voltage through resistor 39 to the bases of transistors 23 and 25.

Thus on one half cycle of AC the winding outpt connected in circuit with diode 33 is positive and the rectifier passes current in that direction into capacitor 37 to charge capacitor 37 to the desired voltage. On the other half cycle the other winding end is at the positive voltage and current is conducted through diode 35 to similarly charge capacitor 37. It is noted that when a DC voltage is initially applied through inductor 47 to this inverter-oscillator circuit that at least one of the transistors will go into the conducting condition even without the bias applied through resistor 39 as if resistor 39 were omitted but due to the normal transient buildup sufficient transformer action occurs to initially generate some voltage in winding 7 which subsequently provides sufficient voltage to start the oscillatory action.

The inverter-oscillator circuit assumes a natural frequency of oscillation dependent upon the electrical impedance characteristics of the electrical load presented to the transistors. The capacitance and inductance inherent in the load, such as the high voltage winding 11 and the capacitor 19, as seen or "reflected" into the primary winding 3, is essentially equivalent to a parallel combination of a capacitor and inductor which forms an anti-resonant circuit in which the frequency of anti-resonance is characterized by the equation $Fo = \frac{1}{2\pi} \sqrt{LC}$. There thus exists a condition in the described circuit in which an inductively smoothed DC current is fed into the primary winding and a sinusoidal AC voltage is developed across the primary winding as well as across each of the secondary windings.

In this connection the sinusoidal AC voltage which appears across winding 5 alternates the voltage at the base of each of transistors 23 and 25 between positive and negative, thus controlling those transistors, biasing one to turn it on while similarly biasing the other to turn it off, and vice versa.

As illustrated, each of the transistors 23 and 25 is of the NPN variety, although PNP types may be used by simple circuit modifications. With slight circuit modifications, other types of semiconductor switching devices may be substituted for the transistors. Capacitor 27 connected across the primary winding serves as part of the load seen by the transistors in one of its functions and thus increases the effective capacity in the effective anti-resonant circuit so as to lock the oscillator to a lower free-running frequency than were this capacitor omitted. Additionally, capacitor 27 serves to absorb any high frequency energy that may be developed in any nonlinearity in the load, such as the magnetron 13, as may be coupled back into the primary through any of the leakage inductance, however minor, in the transformer. Thirdly, the capacitor serves to smooth somewhat any high voltage transients as may appear across the inductor to lead 29. Capacitor 49 is included preferably to absorb any high frequency energy as might otherwise pass from the inverter circuit back out to the line over lines 41 and 42. If it is desired, the capacitance value of this capacitor can be increased to the point where such capacitor will also smooth the rectified DC in a conventional manner. The magnetron is an electron tube which relies for operation upon the emission of electrons from its cathode and the conversion of DC energy thereby to high frequency microwave energy.

The AC voltage developed across low voltage winding 9, which is made of a relatively small number of turns of wire, is applied via the electrical leads to the magnetron heater filament 17 and an AC current therethrough generates the requisite heat to raise the temperature of the electron emissive cathode. As is known, the magnetron is generally designed to provide optimum microwave power output when the cathode thereof is at a predetermined or "rated" temperature. The high-frequency high-voltage AC of the inverter appears across winding 11, which is made of a relatively large number of turns of wire, through transformer action. On one-half cycle of AC, current flows through capacitor 19 and diode 21 back to the other end of the winding to charge capacitor 19 to a predetermined voltage level. On the alternate AC half-cycle, when the polarity of the AC voltage across the winding 11 is reversed, the voltage on the capacitor 19 is added, effectively, to the voltage across winding 11, and the voltages are of the proper polarity to pass through the magnetron from the anode 15 through the heater back to the capacitor to discharge the capacitor at least partially. The structure and operation of the capacitor rectifier is recognized as that of the half-wave voltage doubler by those skilled in the art, such as is illustrated in Feinberg, U.S. Pat. No. 3,396,342.

The magnetron conducts current only when the voltage applied between its anode and cathode is of the proper level and polarity with the anode at a positive polarity relative to the cathode, and conducts only after the voltage so applied reaches a predetermined level.

As is well known in the art of magnetrons, the microwave energy generated by the magnetron may be varied within limits by varying the current which flows between its anode and cathode. In turn, such "anode" current level is dependent upon the level of voltage applied to the magnetron anode as well as the electron emissivity of its cathode. Moreover, the relationship between the anode voltage and the resultant anode current is not in direct proportion. Thus, for example, a 10 percent increase in the voltage level applied to the magnetron may result in a greater increase in anode current, such as a 100 percent increase and thus a 100 percent increase in power output. This variation is a course limited by the rated capacity of the magnetron to handle such power levels without damage due to the thermal or like effects. The converse is true in lowering the anode voltage. Thus two ways in which the power output of the magnetron may be varied is through the control of the cathode emissivity and through the variation of the plate voltage.

Assuming that AC voltage applied to leads 41 and 42 is now lowered, the DC voltage output at the bridge rectifier is decreased and a lower current through inductor 47 results. Accordingly the current through primary windings 3 in the inverter-oscillator operating in the manner previously described is reduced and hence the voltages generated in each of the transformer secondary windings is reduced. Consider a 10 percent reduction in voltage, it is noted that the bias voltage level obtained from secondary 7 is similarly reduced, by perhaps 10 percent. This has negligible effect upon the operation of the inverter-oscillator because as the voltage supplied to the magnetron decreases, so does the current through the magnetron, and the transistors thereby require less drive current from the base circuit.

Secondly, consider the reduction of the AC voltage across control secondary winding 5 as being reduced 10 percent. This has very little effect on operation of the inverter-oscillator because this winding functions as a switch only and can satisfactorily perform even at very low voltage levels.

Consider now a 10 percent reduction in the output voltage at heater secondary winding 9. This results in approximately 10 percent less current flow into the heater 17 and reduces slightly the emissivity of the magnetron cathode.

Consider further a 10 percent reduction in high voltage appearing across high voltage secondary winding 11. This results in a lower voltage between the anode and cathode of the magnetron and, as previously discussed, a greater than 10 percent, perhaps 100 percent, reduction in anode current and a consequent 100 percent reduction in magnetron output power to lower the output microwave energy generated for cooking foodstuffs. Inasmuch as there is less demand for current from the cathode, the fact that the emissivity of cathode 17 has been reduced by a 10 percent reduction in heater current does not pose any disadvantage since the demand for anode current, because of the reduced anode voltage, is reduced. In certain prior art power supplies, the need for a separate filament or heater transformer for the magnetron was avoided by incorporating a low voltage secondary winding on the high voltage transformer. The avoidance of a separate filament transformer is thus similarly achieved in the successful incorporation of a heater winding on the ferrite transformer core.

There is thus no danger of placing high electric fields across the cathode that might tear material off and destroy the cathode.

A similar analogy in the mode of operation of the invention is made when the line voltage applied across leads 41 and 42 is increased by 10 percent. As has been described, the power output of the magnetron may thus be varied in a continuous manner by varying the AC voltage applied at 41 and 42, while using the same transformer which supplies the high voltage to the magnetron to supply the magnetron filament voltage. One of the simple ways in which the AC voltage level or power control can be exerted is by the use of a Triac-type power control, as represented symbolically in FIG. 2. Thus in FIG. 2 I show the two leads for connection to the 120-volt 60-cycle AC line voltage, a Triac power control 51 coupled to a rectifier, such as a rectifier bridge 53, which has its output in turn connected to an inverter-oscillator 55 and to a magnetron rectifier combination supplying both anode voltage and heater voltage as represented generally at 57. Typical Triac-type power controls operate on the principle of not conducting current until a predetermined phase of the sinusoidal AC line voltage to thus vary the amount of current that is allowed into the circuit, although the output is still AC. The rectifier accordingly provides higher or lower DC voltage in dependence upon this and an inverter-oscillator operates along the principles described in connection with FIG. 1 to provide the power to the magnetron 57. Other types of regulators would work as well as the Triac-type, including SCR or a combination bridge rectifier circuit employing SCR's.

It is believed that the foregoing embodiments of my invention are described in sufficient detail to enable one skilled in the art to make and use the invention. It is understood, however, that my invention is not to be limited to those details presented for that purpose but is to be broadly construed to include all improvements, substitutions and equivalents as may now or hereinafter exist within the full spirit and scope of the appended claims.

What I claim is:

1. In combination:
    a transformer, said transformer having a core of ferrite magnetic material with said core having a gap of nonmagnetic material between ferrite portions thereof,
    a primary winding,
    a first high voltage secondary winding,
    a second low voltage secondary winding,
    a third low voltage secondary winding,
    a fourth low voltage secondary winding, with said windings located on said ferrite core;
    said primary winding having a predetermined electrical inductance characteristic and having first and second winding ends and a center tap connected to essentially the middle of said primary to thereby divide said primary into first and second primary winding halves;

first and second semiconductor switch means, each of said switch means having a control input and a pair of output terminals for providing a low impedance current conducting circuit between the output terminals during the interval in which a suitable control voltage is present at the said control input thereof;

rectifying means, said rectifying means having an input and output, with the input connected to said second secondary winding, said rectifying means responsive to AC voltage at an input for applying DC voltage to its output;

means, including resistance means, coupling the output of said rectifying means in circuit with a control input of one of said semiconductor switch means for applying a DC bias voltage thereto;

means connecting said third secondary winding in circuit between the control input of said first semiconductor switch means and the control input of said second semiconductor switch means for applying any Ac voltage appearing thereacross said winding to said control inputs in an opposite phase relationship, whereby a suitable control voltage is applied to the control inputs of said switch means one-at-a-time during each cycle of AC voltage;

a magnetron for generating microwave frequency energy, said magnetron having a heater-cathode and an anode;

means coupling said fourth secondary winding in circuit with said heater cathode of said magnetron for applying high frequency low voltage AC from said winding to said heater;

a rectifier diode having an anode and cathode;

means connecting said rectifier diode in circuit across said magnetron with the cathode end thereof connected to the magnetron anode for permitting the diode to conduct current when the polarity of voltage thereacross is of one polarity and permitting the magnetron to conduct current when the voltage thereacross is of the opposite polarity;

first capacitor means;

means connecting said first high voltage secondary winding, said capacitor means, and said parallel combination of rectifying diode and magnetron in an electrical series circuit;

means connecting one of said primary winding halves and said output terminals of said first semiconductor switch means in a first current conducting path;

means connecting the other of said primary winding halves and said output terminals of said second semiconductor switch means in a second current conducting path; and a source of DC connected to both said current conducting paths, said source including:

means for supplying an inductively smoothed DC current into said primary winding, whereby a high frequency AC voltage is generated across said primary winding and in each of said secondary windings.

2. The invention as defined in claim 1 wherein said DC source comprises:

a source of DC current;

inductor means connected electrically in series with said source, said inductor means having an electrical inductance characteristic substantially greater than the inductance characteristic of said primary winding.

3. The invention as defined in claim 2 further comprising:

second capacitor means, said capacitor means connected in circuit across said primary winding.

4. In combination:

an inverter-oscillator responsive to DC current for generating high frequency AC substantially higher in frequency than 60 Hz., said inverter-oscillator including:

a transformer, said transformer having a gapped ferrite core;

a first low voltage secondary winding consisting essentially of a small number of turns of electrically insulated wire;

a second high voltage secondary winding consisting essentially of a relatively large number of turns of electrically insulated wire, and a primary winding having a center tap;

a magnetron for generating microwave frequency energy, said magnetron including a heater-cathode terminal and an anode terminal;

means coupling said first secondary winding in circuit with said heater-cathode;

means, including capacitor means and rectifier means, coupled in circuit with said second secondary winding for applying a rectified AC voltage between said heater-cathode terminal and said anode terminal of said magnetron;

and means for supplying inductively smoothed DC current from a DC voltage source into said center tap of said primary winding.

5. The invention as defined in claim 4 wherein said last named means comprises an electrical inductor, said electrical inductor having a predetermined electrical inductance characteristic substantially larger than a corresponding electrical inductance characteristic of said primary winding.

6. The invention as defined in claim 4 wherein said inverter-oscillator further includes:

switching means for passing current into said center tap of said primary winding alternately through one-half of said primary winding and through the remaining half of said primary winding; and wherein said means for supplying inductively smooth DC current from a DC voltage source into said center tap of said primary winding comprises a source of DC voltage, electrical inductance means, and means connecting said source and inductance means in electrical series circuit.

7. The invention as defined in claim 4 wherein said means for applying rectified AC voltage comprises:

a diode having a cathode and an anode, said diode being connected in circuit across said magnetron with its cathode connected in direct circuit with said anode terminal of said magnetron so as to electrically pole said diode opposite to the polarity of said magnetron;

a capacitor, said capacitor being connected electrically in series between one of said secondary winding and one of said heater-cathode or said anode and the remaining end of said secondary winding being connected to the other of said heater-cathode and said anode.

8. The invention as defined in claim 4 further comprising an adjustable DC source coupled to said last named means, whereby the level of current therefrom may be selectively adjusted to different levels.

9. The invention as defined in claim 5 further comprising an adjustable DC source coupled to said electrical inductor, whereby the level of current therefrom may be selectively adjusted to different levels to establish the level of constant current.

10. The invention as defined in claim 8 wherein said DC source further includes: means for receiving low frequency AC current of about 50 to 60 Hertz at an input and rectifying and applying said rectified AC at an output.

11. The invention as defined in claim 9 wherein said DC source further includes: means for receiving low frequency AC current of about 50 to 60 Hertz at an input and rectifying and applying said rectified AC at an output.

* * * * *